United States Patent
Haney et al.

(10) Patent No.: US 6,545,745 B2
(45) Date of Patent: Apr. 8, 2003

(54) EXTREME-UV LITHOGRAPHY VACUUM CHAMBER ZONE SEAL

(75) Inventors: Steven J. Haney, Tracy, CA (US); Donald Joe Herron, Manteca, CA (US); Leonard E. Klebanoff, San Ramon, CA (US); William C. Replogle, Livermore, CA (US)

(73) Assignee: EUV LLC, Santa Clara, CA (US)

( * ) Notice: Subject to any disclaimer, the term of this patent is extended or adjusted under 35 U.S.C. 154(b) by 127 days.

(21) Appl. No.: 09/985,876

(22) Filed: Nov. 6, 2001

(65) Prior Publication Data

US 2002/0048003 A1 Apr. 25, 2002

Related U.S. Application Data

(62) Division of application No. 09/229,826, filed on Jan. 13, 1999, now Pat. No. 6,333,775.

(51) Int. Cl.[7] .................. G03B 27/52; G03B 27/60; G03B 27/42
(52) U.S. Cl. .................. 355/30; 355/73; 355/53
(58) Field of Search .................. 355/73, 30, 53, 355/76, 67; 29/25.01; 438/908

(56) References Cited

U.S. PATENT DOCUMENTS

| | | |
|---|---|---|
| 4,018,059 A | 4/1977 | Hatch |
| 5,267,292 A | 11/1993 | Tanaka et al. |
| 5,559,584 A * | 9/1996 | Miyaji et al. .................. 355/30 |
| 5,593,164 A | 1/1997 | Mraz et al. |
| 5,611,207 A | 3/1997 | Hess |
| 5,613,367 A | 3/1997 | Chen |
| 5,944,857 A * | 8/1999 | Edwards et al. ........... 29/25.01 |
| 6,024,685 A | 2/2000 | Kirsch |
| 6,031,598 A | 2/2000 | Tichenor et al. |
| 6,042,121 A | 3/2000 | Ma |

* cited by examiner

Primary Examiner—Russell Adams
Assistant Examiner—Peter B. Kim
(74) Attorney, Agent, or Firm—Fliesler, Dubb, Meyer and Lovejoy, LLP (57) ABSTRACT

Control of particle contamination on the reticle and carbon contamination of optical surfaces in photolithography systems can be achieved by the establishment of multiple pressure zones in the photolithography systems. The different zones will enclose the reticle, projection optics, wafer, and other components of system. The system includes a vacuum apparatus that includes: a housing defining a vacuum chamber; one or more metrology trays situated within the vacuum chamber each of which is supported by at least one support member, wherein the tray separates the vacuum chamber into a various compartments that are maintained at different pressures; and conductance seal devices for adjoining the perimeter of each tray to an inner surface of the housing wherein the tray is decoupled from vibrations emanating from the inner surface of the housing.

25 Claims, 4 Drawing Sheets

EXTREME-UV LITHOGRAPHY VACUUM CHAMBER ZONE SEAL

This application is a divisional of application Ser. No. 09/229,826, filed on Jan. 13, 1999 now U.S. Pat. No. 6,333,775.

This invention was made with Government support under Contract No. DE-AC04-94AL85000 awarded by the U.S. Department of Energy to Sandia Corporation. The Government has certain rights to the invention.

FIELD OF THE INVENTION

The invention relates to projection lithography employing soft x-rays and in particular to a lithographic system including a multi-chamber housing the reticle, optics, e.g., camera, and wafer zones. The zones are vibrationally isolated and maintained at different pressures with the aid of conductance limiting seals.

BACKGROUND OF THE INVENTION

In general, lithography refers to processes for pattern transfer between various media. A lithographic coating is generally a radiation-sensitized coating suitable for receiving a projected image of the subject pattern. Once the image is projected, it is indelibly formed in the coating. The projected image may be either a negative or a positive of the subject pattern. Typically, a "transparency" of the subject pattern is made having areas which are selectively transparent, opaque, reflective, or non-reflective to the "projecting" radiation. Exposure of the coating through the transparency causes the image area to become selectively crosslinked and consequently either more or less soluble (depending on the coating) in a particular solvent developer. The more soluble (i.e., uncrosslinked) areas are removed in the developing process to leave the pattern image in the coating as less soluble crosslinked polymer.

Projection lithography is a powerful and essential tool for microelectronics processing. As feature sizes are driven smaller and smaller, optical systems are approaching their limits caused by the wavelengths of the optical radiation. "Long" or "soft" x-rays (a.k.a. Extreme UV) (wavelength range of $\lambda = 100$ to $200$ Å ("Angstrom")) are now at the forefront of research in efforts to achieve the smaller desired feature sizes. Soft x-ray radiation, however, has its own problems. The complicated and precise optical lens systems used in conventional projection lithography do not work well for a variety of reasons. Chief among them is the fact that there are no transparent, non-absorbing lens materials for soft x-rays and most x-ray reflectors have efficiencies of only about 70%, which in itself dictates very simple beam guiding optics with very few surfaces.

One approach has been to develop cameras that use only a few surfaces and can image with acuity (i.e., sharpness of sense perception) only along a narrow arc or ringfield. Such cameras then scan a reflective mask across the ringfield and translate the image onto a scanned wafer for processing. Although cameras have been designed for ringfield scanning, e.g., Jewell et al., U.S. Pat. No. 5,315,629 and Offner, U.S. Pat. No. 3,748,015, available condensers that can efficiently couple the light from a synchrotron source to the ringfield required by this type of camera have not been fully explored. Furthermore, full field imaging, as opposed to ringfield imaging, requires severely aspheric mirrors in the camera. Such mirrors cannot be manufactured to the necessary tolerances with present technology for use at the required wavelengths.

The present state-of-the-art for Very Large Scale Integration ("VLSI") involves chips with circuitry built to design rules of 0.25 µm. Effort directed to further miniaturization takes the initial form of more fully utilizing the resolution capability of presently-used ultraviolet ("UV") delineating radiation. "Deep UV" (wavelength range of $\lambda = 0.3$ µm to 0.1 µm), with techniques such as phase masking, off-axis illumination, and step-and-repeat may permit design rules (minimum feature or space dimension) of 0.18 µm or slightly smaller.

To achieve still smaller design rules, a different form of delineating radiation is required to avoid wavelength-related resolution limits. One research path is to utilize electron or other charged-particle radiation. Use of electromagnetic radiation for this purpose will require x-ray wavelengths.

Two x-ray radiation sources are under consideration. One source, a plasma x-ray source, depends upon a high power, pulsed laser (e.g., a yttrium aluminum garnet ("YAG") laser), or an excimer laser, delivering 500 to 1,000 watts of power to a 50 µm to 250 µm spot, thereby heating a source material to, for example, 250,000° C., to emit x-ray radiation from the resulting plasma. Plasma sources are compact, and may be dedicated to a single production line (so that malfunction does not close down the entire plant). Another source, the electron storage ring synchrotron, has been used for many years and is at an advanced stage of development. Synchrotrons are particularly promising sources of x-rays for lithography because they provide very stable and defined sources of x-rays.

A variety of x-ray patterning approaches are under study. Probably the most developed form of x-ray lithography is proximity printing. In proximity printing, object:image size ratio is necessarily limited to a 1:1 ratio and is produced much in the manner of photographic contact printing. A fine-membrane mask is maintained at one or a few microns spacing from the wafer (i.e., out of contact with the wafer, thus, the term "proximity"), which lessens the likelihood of mask damage but does not eliminate it. Making perfect masks on a fragile membrane continues to be a major problem. Necessary absence of optics in-between the mask and the wafer necessitates a high level of parallelism (or collimation) in the incident radiation. X-ray radiation of wavelength $\lambda \leq 16$ Å is required for 0.25 µm or smaller patterning to limit diffraction at feature edges on the mask.

Projection lithography has natural advantages over proximity printing. One advantage is that the likelihood of mask damage is reduced, which reduces the cost of the now larger-feature mask. Imaging or camera optics in-between the mask and the wafer compensate for edge scattering and, so, permit use of longer wavelength radiation. Use of extreme ultra-violet radiation (ak.a., soft x-rays) increases the permitted angle of incidence for glancing-angle optics. The resulting system is known as extreme UV ("EUVL") lithography (a.k.a., soft x-ray projection lithography ("SXPL")).

A favored form of EUVL is ringfield scanning. All ringfield optical forms are based on radial dependence of aberration and use the technique of balancing low order aberrations, i.e., third order aberrations, with higher order aberrations to create long, narrow illumination fields or annular regions of correction away from the optical axis of the system (regions of constant radius, rotationally symmetric with respect to the axis). Consequently, the shape of the corrected region is an arcuate or curved strip rather than a straight strip. The arcuate strip is a segment of the circular ring with its center of revolution at the optic axis of the camera. See FIG. 4 of U.S. Pat. No. 5,315,629 for an exemplary schematic representation of an arcuate slit defined by width, W, and length, L, and depicted as a portion of a ringfield defined by radial dimension, R, spanning the distance from an optic axis and the center of the arcuate slit. The strip width is a function of the smallest feature to be printed with increasing residual astigmatism, distortion, and Petzval curvature at distances greater or smaller than the design radius being of greater consequence for greater resolution. Use of such an arcuate field allows minimization of radially-dependent image aberrations in the image. Use of object:image size reduction of, for example, 5:1 reduction, results in significant cost reduction of the, now, enlarged-feature mask.

It is expected that effort toward adaptation of electron storage ring synchrotron sources for EUVL will continue. Economical high-throughput fabrication of 0.25 µm or smaller design-rule devices is made possible by use of synchrotron-derived x-ray delineating radiation. Large angle collection over at least 100 mrad will be important for device fabrication. Design of collection and processing optics for the condenser is complicated by the severe mismatch between the synchrotron light emission pattern and that of the ringfield scan line.

Aside from the quality of the optics that are employed in EUVL systems, factors that influence the quality of the printed wafers fabricated include the ability of the systems to prevent contaminants from depositing onto the surfaces of lens and mirrors and other optical devices. A possible source of contaminants are the hydrocarbons generated by the wafer upon exposure to radiation. Reducing the amount of such deposits will enhance overall quality and performance. Another factor that will affect the quality of the printed wafer is the ability of projection photolithography systems to be vibrationally isolated.

SUMMARY OF THE INVENTION

The invention is based in part on the recognition that control of particle contamination on the reticle and carbon contamination of optical surfaces in photolithography systems can be achieved by the establishment of multiple pressure zones in the photolithography systems. The different zones will enclose the reticle, projection optics, wafer, and other components of system.

Accordingly, in one aspect, the invention is directed to a seal assembly for connecting first and second members that are spaced apart and for providing a conductance limiting path, the seal assembly including:

a support that is attached to the first member;

means for adjusting the height of the support, wherein the support and the second member define an aperture; and means for sealing the aperture.

In another aspect of the invention is directed to a vacuum apparatus that includes:

housing defining a vacuum chamber;

a tray situated within the vacuum chamber which is supported by at least one support member, wherein the tray separates the vacuum chamber into a first compartment and a second compartment which are at different pressures; and means for adjoining the perimeter of the tray to an inner surface of the housing wherein the tray is decoupled from vibrations emanating from the housing and wherein the means for adjoining the perimeter of the tray comprises a conductance limiting seal.

In a further aspect, the invention is directed to a vacuum apparatus that includes:

a housing having an outer enclosure that defines a cavity and an inner enclosure that defines a vacuum chamber wherein the inner enclosure is positioned with the cavity;

a tray situated within the vacuum chamber which is supported by at least one support member, wherein the tray separates the vacuum chamber into a first compartment and a second compartment which are at different pressures;

means for adjoining the perimeter of the tray to an inner surface of the inner enclosure wherein the tray is decoupled from vibrations emanating from the inner enclosure; and means for releasably attaching the inner enclosure to outer inner enclosure wherein the inner enclosure is decoupled from vibrations emanating from the outer enclosure.

In yet another aspect, the invention is directed to a photolithography system that includes:

a housing having an outer enclosure that defines a cavity and an inner enclosure that defines a vacuum chamber wherein the inner enclosure is positioned with the cavity;

a first tray situated within the vacuum chamber which is supported by at least one first support member, wherein the first tray separates the vacuum chamber into a first compartment and a second compartment which are at different pressures;

a second tray that is spaced apart from the first tray and which is situated within the vacuum chamber and which is supported by at least one second support member, wherein the second tray defines a third chamber that is at a different pressure from that of the first chamber and second chamber;

means for adjoining the perimeter of the first tray to a first inner surface of the inner enclosure wherein the first tray is decoupled from vibrations emanating from the inner enclosure;

means for adjoining the perimeter of the second tray to a second inner surface of the inner enclosure wherein the second tray is decoupled from vibrations emanating from the inner enclosure; and means for releasably attaching the inner enclosure to the outer enclosure wherein the inner enclosure is decoupled from vibrations emanating from the outer enclosure.

In a yet another aspect, the invention is directed to a photolithography system that includes:

a housing having an outer enclosure that defines a cavity and an inner enclosure that defines a vacuum chamber wherein the inner enclosure is positioned with the cavity;

a first tray situated within the vacuum chamber which is supported by at least one first support member, wherein the first tray separates the vacuum chamber into a first compartment and a second compartment which are at different pressures;

a second tray that is spaced apart from the first tray and which is situated within the vacuum chamber and which is supported by at least one second support member, where in the second tray defines a third chamber that is at a different pressure from that of the first chamber and second chamber;

a reticle stage positioned within the first chamber that supports a reflective reticle;

a wafer stage positioned within the third chamber that supports a wafer;

a projection optics device positioned in the second chamber that projects extreme ultraviolet radiation toward the reflective reticle;

a camera that collects extreme radiation reflected from the reflective reticle and directing the radiation toward the wafer;

means for adjoining the perimeter of t he first tray to a first inner surface of the inner enclosure where in the first tray is decoupled from vibrations emanating from the inner enclosure;

means for adjoining the perimeter of the second tray to a second inner surface of the inner enclosure wherein the second tray is decoupled from vibrations emanating from the inner enclosure; and means for releasably attaching the inner enclosure to the outer enclosure wherein the inner enclosure is decoupled from vibrations emanating from the outer enclosure.

In a preferred embodiment, the means for adjoining the perimeter of the first tray comprises a conductance limiting seal and the means for adjoining the perimeter of the second tray comprises a conductance limiting seal. In addition, the means for releasably attaching the outer enclosure comprises a conductance limiting seal. The trays typically are metrology trays supporting various instruments integral to controlling and operating the photolithography process. The metrology trays in effect function as dividing planes in vacuum chamber.

DETAILED DESCRIPTION OF THE INVENTION

Figure 1:
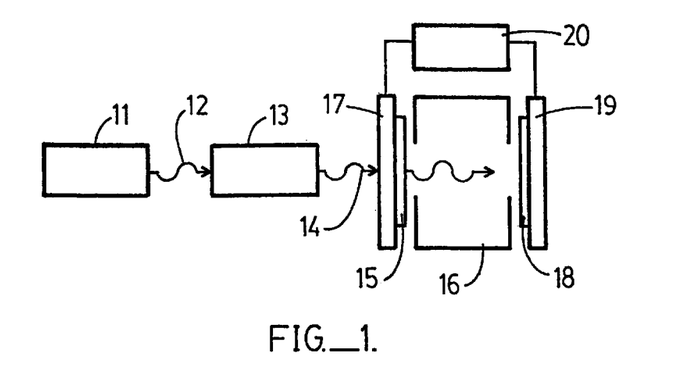
FIG. 1 is a schematic of the main elements of an exemplary photolithography apparatus.

FIG. 1 schematically depicts an apparatus for EUV lithography that comprises a radiation source 11, such as a synchrontron or a laser plasma source, that emits x-rays 12 into condenser 13 which in turn emits beam 14 that illuminates a portion of reticle or mask 15. The emerging patterned beam is introduced into the imaging optics 16 which projects an image of mask 15, shown mounted on mask stage 17, onto wafer 18 which is mounted on stage 19. Element 20, an x-y scanner, scans mask 15 and wafer 18 in such direction and at such relative speed as to accommodate the desired mask-to-image reduction.

As described in further detail herein, the wafer is housed in a wafer chamber that is separated from the other elements of the photolithography system located upstream as illustrated in FIG. 1. These other elements can be housed in one or more chambers which are preferably maintained in vacuum to minimize attenuation of the x-rays. EUV radiation projected from the mask and translated by the camera travels through an aperture in the wafer chamber.

The EUV lithography device of the present invention is particularly suited for fabricating integrated devices that comprise at least one element having a dimension of $\leq 0.25$ $\mu$m. The process comprises construction of a plurality of successive levels by lithographic delineation using a mask pattern that is illuminated to produce a corresponding pattern image on the device being fabricated, ultimately to result in removal of or addition of material in the pattern image regions.

Typically, where lithographic delineation is by projection, the collected radiation is processed to accommodate imaging optics of a projection camera and image quality that is substantially equal in the scan and cross-scan directions, and smoothly varying as the space between adjacent lines varies. In a preferred embodiment, projection comprises ringfield scanning comprising illumination of a straight or arcuate region of a projection mask. In another preferred embodiment, projection comprises reduction ringfield scanning in which an imaged arcuate region on the image plane is of reduced size relative to that of the subject arcuate region so that the imaged pattern is reduced in size relative to the mask region.

The individual elements that form the EUV lithography device as shown in FIG. 1 can comprise conventional optical devices, e.g., condensers, cameras, and lens, for projection EUV lithography. Preferably the EUVL device employs a condenser that collects soft x-rays for illuminating a ringfield camera. A particularly preferred EUVL device that employs a condenser having a diffraction grating on the surface of a mirror upstream from the reflective mask that enhances critical dimension control is described in Sweatt et al., U.S. patent application Ser. No. 09/130,224, entitled "Diffractive Element in Extreme-UV Lithography Condenser" filed on Aug. 6, 1998, now U.S. Pat. No. 6,118,577, issued Sep. 12, 2000, which is incorporated by reference. The condenser illustrated therein has the ability to separate the light from a line or quasi point source at the entrance pupil into several separated lines or transform point foci that are still superimposed on each other at the ringfield radius, thus maximizing the collection efficiency of the condenser and smoothing out any inhomogeneities in the source optics.

Figure 2:
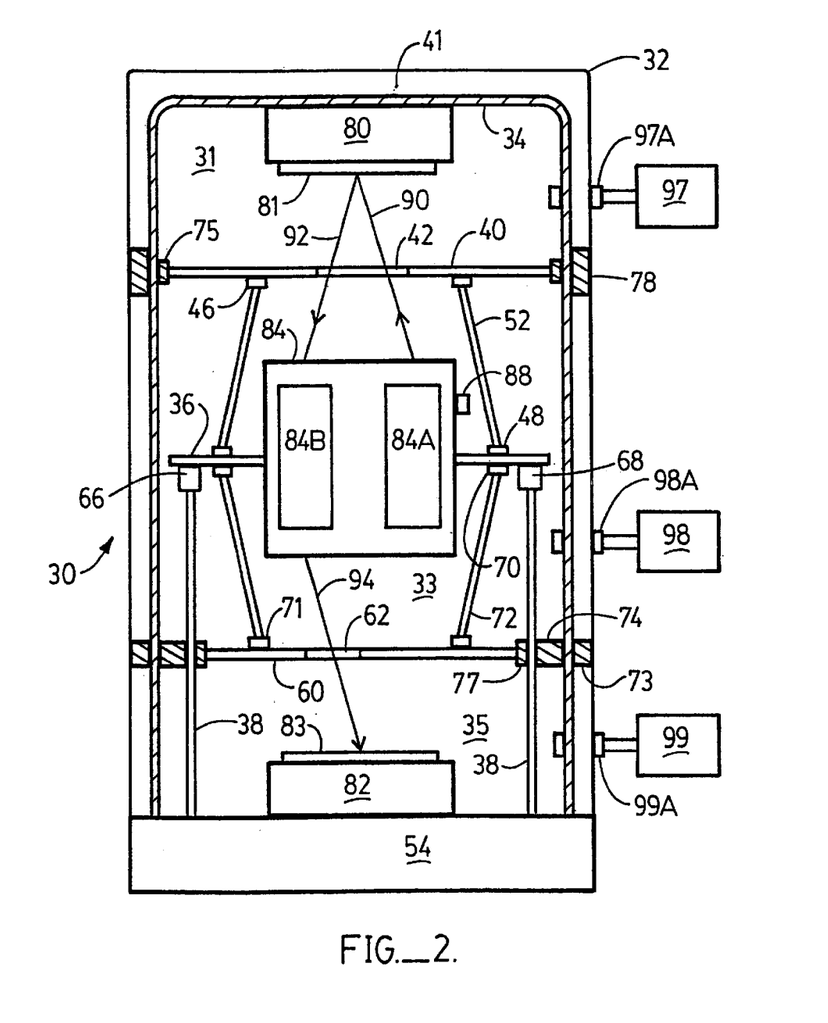
FIG. 2 is a schematic of a photolithography apparatus including the reticle, optics, and wafer zones.

FIG. 2 depicts a cross-sectional view of a photolithography vacuum apparatus 30 that preferably has a cylindrical cross section. The apparatus includes a housing having an outer enclosure 32 and an inner support structure or bridge 34 that is isolated from environmental noise and vibrations. The outer enclosure 32 and bridge define gap 41 there-inbetween and they both rest on base or pedestal 54.

The photolithography vacuum apparatus 30 preferably has three zones or regions into which the various EUV lithography components are positioned. The zones are created by reticle metrology tray 40 and wafer metrology tray 60. Positioned near the center of the vacuum apparatus 30 is platform 36 which comprises a disk-shaped member having an inner aperture. Platform 36 is supported by a plurality of vibration isolators 66 and 68 which serve to dampen vibrations that may come from the surrounding environment. A suitable vibration isolator is commercially available from Integrated Dynamics Engineering, Inc. In a preferred embodiment, three vibration isolators positioned 120 degrees apart are employed. The vibration isolators in turn are supported by isolator support frame 38 which comprises a hollow cylinder that rests on base 54. The outer perimeter of platform 36 and the inner surface of bridge 34 are separated by an open gap for vibration isolation.

Projecting from the upper surface of platform 36 is upper truss 52 which comprises a hollow cone-shaped cylinder. The lower end of upper truss 52 is attached to the upper surface of platform 36 via ring 48. Upper truss 52 supports reticle metrology tray 40 which has a circular perimeter that generally matches the contour of the inner surface of bridge 34. Specifically, the upper end of upper truss 52 is attached to the lower surface of reticle metrology tray 40 via ring 46. A seal assembly 75, which is described in herein, provides a conductance, i.e., gas, limiting seal between the outer perimeter of reticle metrology tray 40 and bridge 34. Similarly, a seal assembly 78 is positioned between outer enclosure 32 and bridge 34. In this fashion, reticle metrology tray 40 separates reticle zone 31 from optics zone 33. It should be noted that the optics zone encompasses the interior region between the reticle metrology tray 40 and wafer metrology tray 60.

In a similar manner, wafer metrology tray 60, which is positioned at a lower part of the interior region defined by isolator support frame 38, separates wafer zone 35 from optics zone 33. The wafer metrology tray 60 has a circular perimeter which generally matches the contour of the inner surface of isolator support frame 38. The wafer metrology tray is supported by lower truss 72 which comprises a hollow cone-shape cylinder. The upper end of the lower truss 72 is attached to the lower surface of platform 36 via ring 70 and the lower end of the lower truss 72 is attached to the upper surface of wafer metrology tray 60 via ring 71. A seal assembly 77 at the interface of the perimeter of the optics metrology tray 60 and isolator support frame 38 provides a conductance, i.e., gas, limiting seal as further described herein.

The reticle zone 31 encases reticle stage 80 is connected to bridge 34 and has reflective reticle or mask 81 attached thereto. The optics zone 33 encases projection optics devices that are collectively situated in projection optics box 84. In a preferred embodiment, EUV radiation is collected from a source (not shown) and a plurality of beams from the source are transformed into a plurality of substantially parallel arc-shaped light beams which are directed through opening 88 to processing and imaging device 84A which transmit a plurality of arc-shaped light beams 90 to reflective mask 81. The reflected light 92 is then translated as beam 94 by camera 84B to wafer 83 that is positioned on wafer stage 82 within wafer zone 35.

To accommodate the transmission of the EUV radiation, reticle metrology tray 40 has aperture 42 through which the light beams 90 and 92 enter and exit. Alternatively, instead of having a single aperture, the reticle metrology tray can comprise two smaller apertures, one for each beam. The size of the aperture(s) should be kept to a minimal since the reticle zone and optics zone are preferably maintained at different pressure levels. Wafer metrology tray 60 includes a window 62 that is made of material having a high EUV radiation transmission factor such as beryilium. As is apparent, wafer metrology tray 60 also serves a barrier that prevents contaminants in the wafer zone from entering the optics zone. Contaminants of primary concern are gaseous hydrocarbons that formed when a wafer typically having a layer of photoresist thereon is exposed to EUV radiation.

The projection optics box 84 has a circular outer surface which is attached to the surface of the aperture of platform 36. In a preferred embodiment, the outer enclosure 32, bridge 34, and isolator support frame 38 form three concentric hollow cylinders at the lower portion of vacuum apparatus 30. As further described herein, conductance limiting seal assembly 73 is situated between the space defined by bridge 34 and outer enclosure 32 and conductance limiting seal assembly 74 is situated between the space defined by bridge 34 and isolator support frame 38.

It should be noted that the upper truss 52, lower truss 72, projection optics box 84, and isolator support frame 38 are typically not solid structures. Specifically, in order to minimize the weight of the photolithography vacuum apparatus these structures have perforations that permit lateral gas movement. One feature of this is that the pressure within optic zone 33 will be substantially uniform throughout.

To maintain the proper vacuum level in each zone, two or more pumps are employed. Reticle zone 31, optics zone 33, and wafer zone 35 are connected to pump 97 through port 97A, pump 98 through port 98A, and pump 99 through port 99A, respectively. In a preferred embodiment, no pump is directly connected to reticle zone 31, rather one or more pumps connected to optics zone 33 is sufficient to maintain the vacuum levels in both zones. The reticle zone is maintained at a vacuum pressure of typically of less than about 100 mTorr and preferably at about 30 mTorr. The optics zone is maintained at a vacuum pressure of less than about 5 mTorr. The wafer zone is maintained at a vacuum pressure of less than about 500 mTorr and preferably at about 200 mTorr. The atmosphere in the zones comprise any suitable inert gas such as, for example, argon and helium.

Figures 3A, 3B:
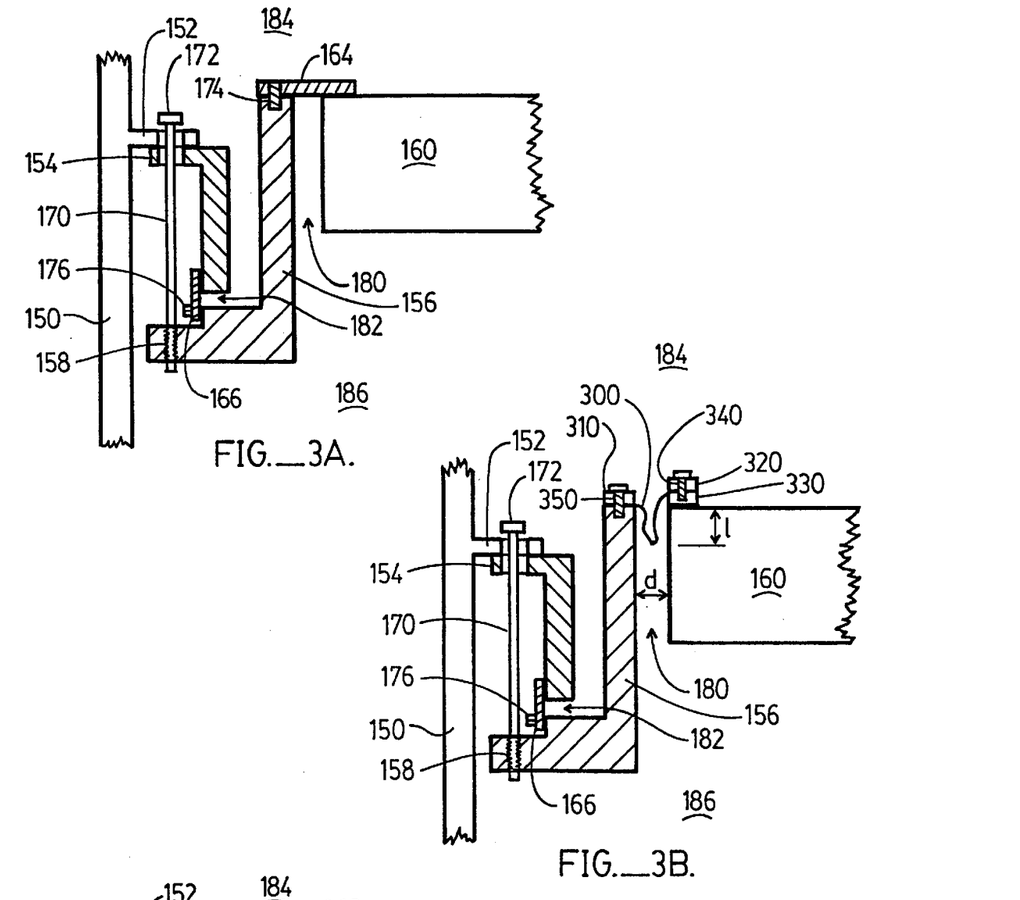
FIGS. 3A, 3B, and 3C illustrate seal assemblies.

As illustrated in FIG. 2, the seal assemblies in the photolithography vacuum chamber help maintain the pressure differentials in the three zones. FIG. 3A shows the general features of a seal assembly that connects an outer circular vertical wall 150 to an inner cantilever structure 160. As is apparent, the vertical wall and cantilever structure represent any adjacent pair of structures where a conductance limiting seal is desired. As shown, the vertical wall includes a cantilever portion 152 that defines a hole through which adjustable screw 170 is inserted. The adjustable screw passes through a flanged seal ring 154 before engaging threaded hole 158 in flanged cylindrical ring 156. A sliding vertical seal 166 covers the aperture 182 that is between the lower end of flanged seal ring 154 and flanged cylindrical ring 156. The vertical seal is held in place with band 176.

The upper portion of flanged cylindrical ring 156 is separated from the adjacent inner cantilever structure 160 by aperture or gap 180. Horizontal seal 164 is attached to the upper portions of the flanged cylindrical ring 156 with screw 174. As is apparent, the vertical and horizontal seals prevent gases from flowing between the upper region 184 and lower region 186.

Typically in constructing the seal assemblies for the photolithography apparatus of FIG. 2, the cantilever structure 160 (e.g., reticle or wafer tray) is positioned in place first and is held in place by appropriate supports means as shown in FIG. 2. Thereafter, the various elements of the seal assembly are lowered into position adjacent the cantilever 160. The flanged cylindrical ring 156 is raised or lowered by moving the head 172 of adjustable screw 170 until the upper surface of the flanged cylindrical ring is substantially flushed with the upper surface of the cantilever structure 160.

FIG. 3B illustrates another embodiment of a seal assembly that connects an outer circular vertical wall 150 to an inner cantilever structure 160. The components of this seal assembly are essentially the same as those of FIG. 3A but this embodiment does not employ the horizontal seal 164, rather, a sheet of polymer material 300 is suspended over aperture 180. Any suitable conductance limiting polymer such as KAYTON or TEFLON (tetrafluoroethylene fluorocarbons) can be employed. The sheet is held in place on one side by outer ring 310 which is secured to the upper surface of flanged cylindrical ring 156 by screw 350. The other side of the sheet is held in place with an inner clamp ring which includes upper ring 320 and lower ring 330. An edge of the sheet is secured between the upper and lower rings which are connected by screw 340. Preferably, sheet 300 is suspended into aperture 180 to a distance (l) of about 1 inch. Typically, aperture 180 has a gap distance (d) of about 0.75 inch. In this fashion, sheet 300, which is preferably about 0.001 inch thick or less, affords sufficient flexibility for vibration isolation. Preferably, the lower ring 330 is not secured to cantilever structure 160. In this manner, when flanged cylindrical ring 156 is raised, attached sheet 300 and the inner clamp ring are also removed.

Figure 3C:
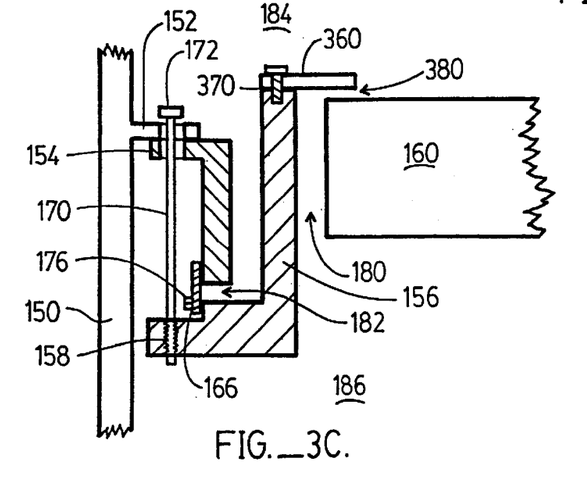

FIG. 3C illustrates a further embodiment of a seal assembly which is particularly suited for being employed as seal assembly 75 or 78 between the reticle zone 31 and the optics zone 33 (FIG. 2). The components of this embodiment are essentially the same as those of FIGS. 3A but it also does not employ the horizontal seal 164, rather plate 360, which preferably is made of metal (e.g., stainless steel), is attached to the upper surface of flanged cylindrical ring 156 so as to substantially cover aperture 180. Preferably, plate 360 is secured by screw 370. The plate does not touch cantilever structure 160, rather a small gap 380 of about 0.008 inch separates the surfaces of the two structures. As is apparent, a small amount of gas will permeate through the gap. It is estimated that the the pressure differential between the reticle zone and the optics zone will cause gas to flow through gap 380 at a rate of about 2 liters per second. However, this amount is negligible in comparison to the estimated 200 l/s that flows through aperture 42 of reticle metrology tray 40. Since plate 360 is not in contact with cantilever structure 160, vibrational isolation is achieved.

As is apparent, the seal assemblies as shown in FIGS. 3A, 3B, and 3C each defines an aperture and means for sealing the aperture. It is evident, that the term "sealing" includes essentially completely covering the aperture as in the first two embodiments and partially covering the aperture as in the third embodiment. In any case, the seal assemblies provide vibration isolation.

Figure 4:
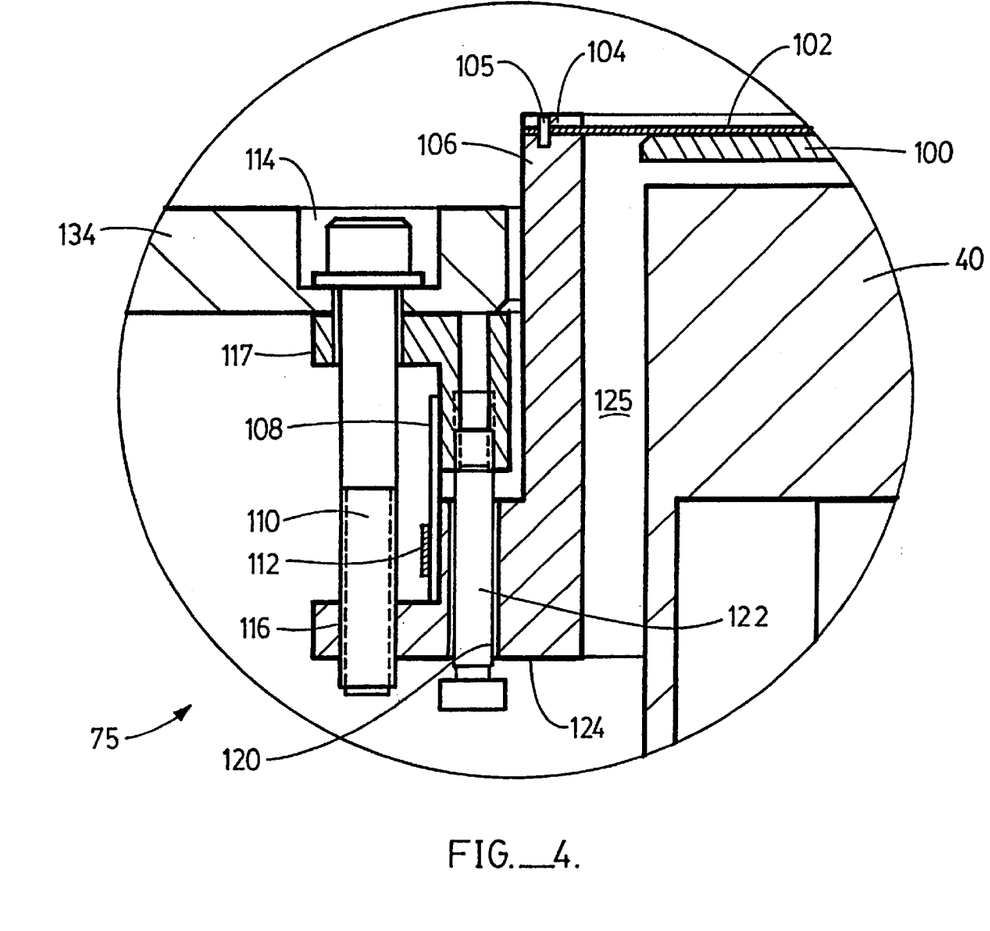
FIG. 4 illustrates the bridge-tray seal.

Referring to FIG. 4, the seal assembly 75 includes an adjustment screw 110 that passes through a hole 114 in a cantilever portion 134 of the bridge 34 (FIG. 2) and engages a threaded hole 116 in flanged cylindrical ring 106. The threaded hole 116 extends parallel to the axial centerline of the flanged cylindrical ring 106, and turning the adjustment screw 110 raises or lowers the flanged cylindrical ring 106. The adjustment means may alternatively comprise any other suitable means, including but not limited to bolts, nuts or ratches.

A through hole 120, also extends parallel to the axial centerline of the flanged cylindrical ring 106, and permits a threaded shoulder screw 122 to pass through and threadingly engage a flanged seal ring 117. The head of the shoulder screw 122 may abut against the bottom surface 124 of the flanged cylindrical ring 106, thereby limiting the distance an operator may lower the flanged cylinder. A band clamp 112 secures a circumferentially fitted sleeve seal 108 around flanged cylindrical ring 106. The band clamp 112 may alternatively secure the circumferentially fitted sleeve seal 108 around the flanged seal ring 117.

A ring seal washer 102 is attached to the flanged cylindrical ring 106 and is held in place by a retainer ring 104 with screw 105. By lowering the flanged cylindrical ring 106, the ring seal washer 102 contacts the top surface of the reticle metrology tray 40 or alternatively contacts a thermal shield 100 located above the reticle metrology tray. The ring seal washer 102 effectively prevents gas from moving through the gap 125 between reticle metrology tray 40 and flanged cylindrical ring 106.

The fitted sleeve seal 108 and the ring seal washer 102 are made of a durable material that is impermeable to gas and that is sufficiently flexible to absorb vibrations. Suitable materials include polymers for example. A preferred material is a polyimide that is commercially available as KAPTON. Typically, the fitted sleeve seal 108 is about 0.001 in. to 0.010 in. thick and the ring seal washer 102 is about 0.001 in. to 0.010 in. thick. In one embodiment, the fitted sleeve seal and the ring seal washer 102 both comprise 0.003 in. thick KAPTON. The ring and washer 102 prevent vibrations from transmitters from cantilever portion 134 to reticle metrology tray 40. The fitted sleeve seal 108 allows vertical adjustment of the ring seal washer 102. Both provide a conductance limited gas seal between the reticle zone and the optics zone.

As illustrated in FIG. 2, seal assembly 75 and seal assembly 77 both are positioned between the perimeter of a metrology tray and an essentially vertical structure. For this reason, both seal assemblies can comprise essentially identical configurations. Therefore, the structure of seal assembly 75 as shown in FIG. 4 can also be employed between the wafer metrology tray 60 and isolator support frame 38.

Figure 5:
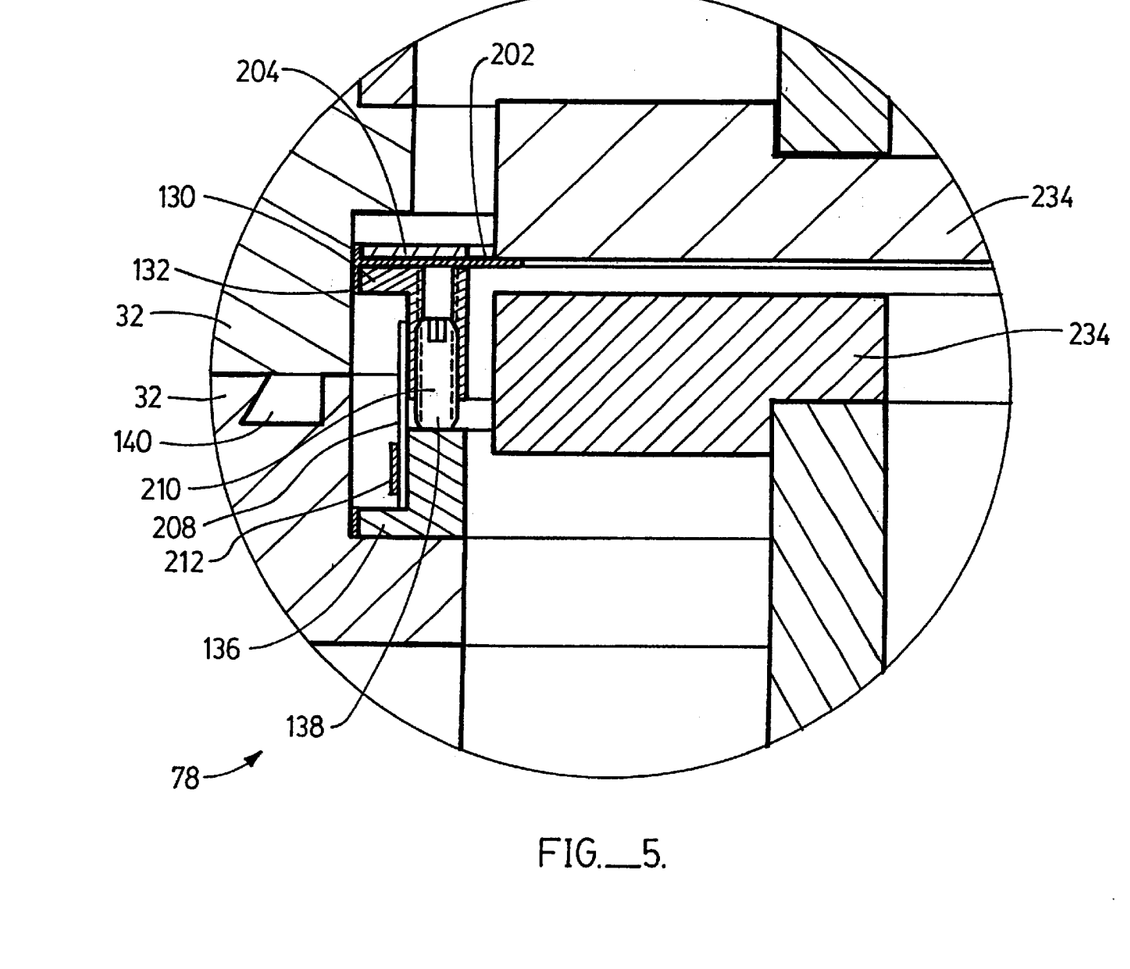
FIG. 5 illustrates the chamber-bridge seal.

Referring to FIG. 5, the resealable seal device 78 includes a ring seal washer 202 attached to an inverted L-shaped flanged cylindrical ring 130 and is held in place by a retainer ring 204. The ring seal washer 202 contacts a flanged portion 234 of the bridge 34 (FIG. 2), thereby creating a seal against the bridge. An annular groove 140 in the top surface of the outer enclosure 32 may receive an O-ring or other sealing device to seal vacuum chamber sections not related to zone seals. A band clamp 212 secures a circumferentially fitted sleeve seal 208 around a lower ring 136 located below the inverted L-shaped flanged cylindrical ring 130. The band clamp 212 may alternatively secure the circumferentially fitted sleeve seal 208 around the inverted L-shaped flanged cylindrical ring 130.

The inverted L-shaped flanged cylindrical ring 130 has a threaded axial hole 138 which contains an adjustment screw 210, and turning the adjustment screw raises or lowers the L-shaped flanged cylinder. The retainer ring 204 may abut against the inside surface wall 132 of the outer chamber 32 or against the top surface of lower rings 136, thereby limiting the distance an operator may raise or lower, respectively, the inverted L-shaped flanged cylindrical ring 130.

The ring seal washer 202 is made of the same material and has the same thickness as ring seal washer 102 (FIG. 4). Similarly, fitted sleeve seal 208 is made of the same material and has the same thickness as fitted sleeve seal 108 (FIG. 4).

The structure of seal assembly 78 as shown in FIG. 5 can also represent the structure for seal assembly 74 between the isolator support frame 38 and bridge 34 as well as the structure of seal assembly 73 between bridge 34 and outer enclosure 32, as shown in FIG. 2.

Although only preferred embodiments of the invention are specifically disclosed and described above, it will be appreciated that many modifications and variations of the present invention are possible in light of the above teachings and within the purview of the appended claims without departing from the spirit and intended scope of the invention.

What is claimed is:

1. A vacuum apparatus comprising:
    a housing defining a vacuum chamber;
    a tray situated within the vacuum chamber which is supported by at least one support member, wherein the tray separates the vacuum chamber into a first compartment and a second compartment which are at different pressures; and
    means for adjoining the perimeter of the tray to an inner surface of the housing wherein the tray is decoupled from vibrations emanating from the housing, wherein the means for adjoining the perimeter of the tray comprises a conductance limiting seal.

2. The vacuum apparatus of claim 1 comprising means for maintaining the first compartment at a first pressure level and the second compartment at a second pressure level.

3. The vacuum apparatus of claim 1 wherein the conductance limiting material is suspended within an aperture between the perimeter of the tray and the inner surface of the housing so that a first side of the conductance limiting material is at a first pressure and a second side of the conductance limiting material is at a second pressure that is different from that of the first side and wherein the conductance limiting material is made of a sufficiently flexible polymer gas limiting material to maintain vibrational isolation of the tray.

4. The vacuum apparatus of claim 3 wherein the conductance limiting material consists essentially of a sheet of polymer material.

5. The vacuum apparatus of claim 3 wherein the conductance limiting material is about 0.001 inch thick or less.

6. The vacuum apparatus of claim 4 wherein the conductance limiting material is about 0.001 inch thick or less.

7. The vacuum apparatus of claim 3 wherein the pressure across the conductance limiting material is about 495 mTorr or less.

8. The vacuum apparatus of claim 4 wherein the pressure across the conductance limiting material is about 495 mTorr or less.

9. The vacuum apparatus of claim 5 wherein the pressure across the conductance limiting material is about 495 mTorr or less.

10. A vacuum apparatus comprising:
a housing having an outer enclosure that defines a cavity and an inner enclosure that defines a vacuum chamber wherein the inner enclosure is positioned with the cavity;
a tray situated within the vacuum chamber which is supported by at least one support member, wherein the tray separates the vacuum chamber into a first compartment and a second compartment which are at different pressures;
means for adjoining the perimeter of the tray to an inner surface of the inner enclosure wherein the tray is decoupled from vibrations emanating from the inner enclosure; and
means for releasably attaching the inner enclosure to outer inner enclosure wherein the inner enclosure is decoupled from vibrations emanating from the outer enclosure.

11. The vacuum apparatus of claim 10 wherein the means for adjoining the perimeter of the tray comprises a conductance limiting seal.

12. The vacuum apparatus of claim 10 wherein the means for releasably attaching the outer enclosure comprises a conductance limiting seal.

13. The vacuum apparatus of claim 10 further comprising means for maintaining the first compartment at a first pressure level and the second compartment at a second pressure level.

14. The vacuum apparatus of claim 11 wherein the conductance limiting material is suspended within an aperture between the perimeter of the tray and the inner surface of the enclosure so that a first side of the conductance limiting material is at a first pressure and a second side of the conductance limiting material is at a second pressure that is different from that of the first side and wherein the conductance limiting material is made of a sufficiently flexible polymer gas limiting material to maintain vibrational isolation of the tray.

15. The vacuum apparatus of claim 14 wherein the conductance limiting material consists essentially of a sheet of polymer material.

16. The vacuum apparatus of claim 14 wherein the conductance limiting material is about 0.001 inch thick or less.

17. The vacuum apparatus of claim 15 wherein the conductance limiting material is about 0.001 inch thick or less.

18. The vacuum apparatus of claim 14 wherein the pressure across the conductance limiting material is about 495 mTorr or less.

19. The vacuum apparatus of claim 15 wherein the pressure across the conductance limiting material is about 495 mTorr or less.

20. The vacuum apparatus of claim 16 wherein the pressure across the conductance limiting material is about 495 mTorr or less.

21. A vacuum apparatus comprising:
a housing with walls that define a vacuum chamber;
a seal assembly that is attached to the walls of the housing and that includes a ring structure having an inner surface;
a tray situated within the vacuum chamber which is supported by at least one support member, wherein the tray separates the vacuum chamber into a first compartment and a second compartment which are at different pressures and wherein the perimeter of the tray and the inner surface of the seal assembly define an aperture; and
means for adjoining the perimeter of the tray to the inner surface of the ring structure wherein the tray is decoupled from vibrations emanating from the housing, and wherein said means for adjoining includes a barrier covering the aperture to maintain a pressure differential between the first compartment and the second compartment wherein said barrier is either (i) a conductance limiting seal or a (ii) a plate that is secured to the seal assembly with the proviso that the plate does not touch the tray.

22. The vacuum apparatus of claim 21 wherein the means for adjoining the perimeter of the tray comprises a conductance limiting seal that is suspended over the aperture.

23. The vacuum apparatus of claim 21 comprising means for maintaining the first compartment at a first pressure level and the second compartment at a second pressure level.

24. The vacuum apparatus of claim 21 wherein the means for adjoining the perimeter of the tray comprises the plate that is secured to the seal assembly but which does not touch the tray.

25. The vacuum apparatus of claim 21 comprising means for maintaining the first compartment at a first pressure level and the second compartment at a second pressure.

* * * * *